(12) United States Patent
Wang et al.

(10) Patent No.: US 10,393,801 B2
(45) Date of Patent: Aug. 27, 2019

(54) FAULT ISOLATION SYSTEM AND METHOD FOR DETECTING FAULTS IN A CIRCUIT

(71) Applicant: Micron Technology, Inc., Boise, ID (US)

(72) Inventors: Wei-Chih Wang, Hsinchu (TW); Bi-Jen Chen, Taoyuan (TW); Hua-Sheng Chen, Hsinchu (TW)

(73) Assignee: Micron Technology, Inc., Boise, ID (US)

( * ) Notice: Subject to any disclaimer, the term of this patent is extended or adjusted under 35 U.S.C. 154(b) by 53 days.

(21) Appl. No.: 15/715,403

(22) Filed: Sep. 26, 2017

(65) Prior Publication Data

US 2018/0017617 A1    Jan. 18, 2018

Related U.S. Application Data

(63) Continuation of application No. 14/953,025, filed on Nov. 27, 2015, now Pat. No. 9,784,788.

(51) Int. Cl.
*G01R 31/28* (2006.01)
*G11C 29/02* (2006.01)
*G11C 29/56* (2006.01)

(52) U.S. Cl.
CPC ........ *G01R 31/2887* (2013.01); *G11C 29/025* (2013.01); *G11C 2029/5602* (2013.01)

(58) Field of Classification Search
CPC . G01R 31/2887; G01R 31/025; G01R 31/024
USPC ....................................... 324/527, 500, 512
See application file for complete search history.

(56) References Cited

U.S. PATENT DOCUMENTS

| 7,365,561 B2 * | 4/2008 | Ito ...................... G01R 1/06761 324/754.07 |
| 8,400,176 B2 | 3/2013 | Arkin et al. |
| 2001/0031040 A1 * | 10/2001 | Kaine ..................... H04M 1/24 379/21 |
| 2003/0210067 A1 | 11/2003 | Miller |

(Continued)

FOREIGN PATENT DOCUMENTS

| CN | 101958262 A | 1/2011 |
| CN | 102385017 A | 3/2012 |

(Continued)

OTHER PUBLICATIONS

Chinese Office Action from Chinese Application No. 201610694195.3, dated Dec. 7, 2018, 5 pages.

(Continued)

*Primary Examiner* — Giovanni Astacio-Oquendo
(74) *Attorney, Agent, or Firm* — TraskBritt

(57) ABSTRACT

The present invention provides a method and a fault isolation system for detecting errors in an integrated circuit. One feature of the present invention is using a movable second probe to scan and acquire an output signal through the vias or metal line structure of a diagnostic area along a detecting line, so as to find the fault location precisely, and another feature of the present invention is using a cutter in conjunction with the above method to narrow down the fault range. The cutter is used to electrically isolate the portion of diagnostic area step by step for approaching the fault location. This method can help to save a lot of analysis time and also makes the minor fault localization possible.

20 Claims, 5 Drawing Sheets

(56) References Cited

U.S. PATENT DOCUMENTS

| | | | | |
|---|---|---|---|---|
| 2006/0217906 A1* | 9/2006 | Barbara | ............... | G01R 1/36 |
| | | | | 702/60 |
| 2010/0281854 A1* | 11/2010 | Huang | ............ | F02D 41/1495 |
| | | | | 60/276 |
| 2011/0012613 A1 | 1/2011 | Gong et al. | | |
| 2012/0182023 A1* | 7/2012 | Zhang | ............ | G01M 11/3109 |
| | | | | 324/501 |
| 2012/0307981 A1* | 12/2012 | Larkin | ............ | H01H 9/0228 |
| | | | | 379/27.01 |

FOREIGN PATENT DOCUMENTS

| | | |
|---|---|---|
| CN | 102760728 A | 10/2012 |
| CN | 104576612 A | 4/2015 |

OTHER PUBLICATIONS

Chinese Office Action and Search Report from Chinese Application No. 201610694195.3, dated May 15, 2018, 9 pages with English translation.

\* cited by examiner

US 10,393,801 B2

FAULT ISOLATION SYSTEM AND METHOD FOR DETECTING FAULTS IN A CIRCUIT

CROSS-REFERENCE TO RELATED APPLICATION

This application is a continuation of U.S. patent application Ser. No. 14/953,025, filed Nov. 27, 2015, now U.S. Pat. No. 9,784,788, issued Oct. 10, 2017, the disclosure of which is hereby incorporated herein in its entirety by this reference.

TECHNICAL FIELD

The present invention relates generally to a fault isolation technique and, more particularly, to a method for isolating faults by cutting a portion of a detecting line for narrowing down the detecting range.

BACKGROUND

Semiconductor memory comprises a plurality of rows of memory cells arranged in columns, the number of which depends on the storage capacity of the storage unit. With the increase of the storage unit, the probability of failure of the memory cell also increases. When a storage unit fails, the semiconductor memory device cannot be used.

Test techniques for memory systems conventionally include the application of predetermined input bit patterns to memory cells of the memory system, and thereafter reading the contents of the memory cells to determine whether the output patterns match the input patterns. If the output patterns do not match the input patterns, it follows that a fault has occurred somewhere in the memory system.

Memory systems, however, are becoming increasingly complex, and the above conventional input/output pattern matching technique does not offer an adequate level of fault isolation for such complex memory systems. What is required, therefore, are test/verification methods and systems which provide a greater degree of fault isolation for complex memory systems.

BRIEF SUMMARY

The present invention provides a method for detecting faults in a circuit, at least comprising the following steps: step (a): a detecting line with a fault portion disposed therein is provided, step (b): a first probe and a second probe are provided, wherein the first probe touches one terminal of the detecting line for providing an input signal to the detecting line, and the second probe touches another terminal of the detecting line for receiving an output signal, step (c): a cutter is used to cut the detecting line, so as to remove a segment of the detecting line, and to define a remaining detecting line, step (d): the second probe is moved to touch a terminal of the remaining detecting line, so as to obtain a new output signal, wherein the new output signal is a normal signal while the fault portion is disposed out of the remaining detecting line, and the new output signal is an abnormal signal while the fault portion is disposed within the remaining detecting line, and step (e): the step (c) and the step (d) mentioned above are repeated until the new output signal becomes the normal signal, so as to obtain a fault localized segment, wherein the fault localized segment has the fault portion disposed therein.

The present invention further provides a fault isolation system, comprising: a detecting line having a fault portion disposed therein, a first probe touching a terminal of a detecting line for providing an input signal to the detecting line, a second probe touching another terminal of the detecting line for receiving an output signal of the detecting line, and a cutter used for removing a portion of the detecting line.

The present invention provides a method for detecting errors or faults in a circuit and also provides a fault isolation system. One feature of the present invention is using the movable second probe to scan the detecting line, so as to find the fault portion precisely, and another feature of the present invention is using the cutter to narrow down the fault range. In this way, the scanning method only needs to be performed within a specific small range. Therefore, the fault portion can be detected quickly and easily.

These and other objectives of the present invention will no doubt become obvious to those of ordinary skill in the art after reading the following detailed description of the preferred embodiment that is illustrated in the various drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
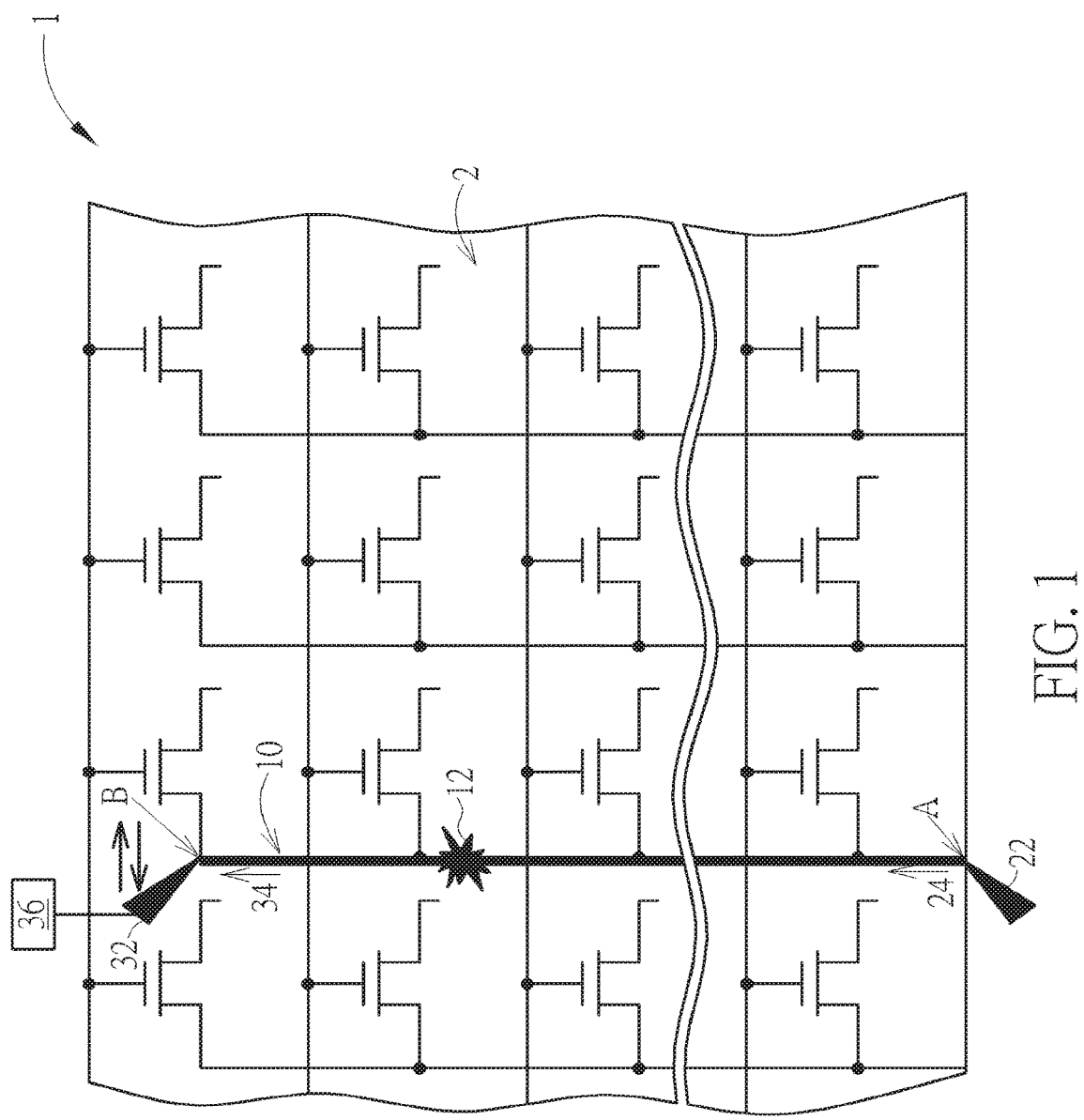
FIG. 1 shows a detecting line of the diagnostic area and a fault isolation system according to the first preferred embodiment of the present invention.

Please refer to FIG. 1, which shows a detecting line and a fault isolation system 1 according to the first preferred embodiment of the present invention. As shown in FIG. 1, firstly, a detecting line 10 is provided, the detecting line 10 may be a word line or a bit line of a memory device such as a dynamic random access memory (DRAM) or other metal traces in an integrated circuit. In this embodiment, the detecting line 10 is one bit line of a DRAM as an example, but the present invention is not limited thereto. The DRAM comprises a plurality of memory cells 2, and the detecting line 10 is connected with a plurality of memory cells 2. By suitable testing tools, the detecting line 10 is conformed to have a fault portion 12 disposed therein. Generally, the fault portion 12 may comprise a shorting issue, an opening issue or other faults. The fault isolation system comprises a first probe 22 and a second probe 32. The first probe 22 touches a terminal A of the detecting line 10, and the first probe 22 is connected with a power source, such as a DC source or an AC source, so as to provide an input signal 24 to the diagnostic area through detecting line 10. On the other hand, the second probe 32 touches, scans and senses another terminal B of the detecting line 10, and the second probe 32 is connected with an electronic measurement system, such as an oscilloscope or other suitable instruments, so as to receive an output signal 34 from vias or metal lines along the detecting line 10. It is noteworthy that in applicant's experiment, the applicant found that if the power source connected with the first probe 22 is an AC source, it will have a relatively clear output signal compared with the case of selecting a DC source as the power source, so preferably, the present invention uses an AC source as the power source connected with the first probe 22, but is not limited thereto.

In the present invention, the first probe 22 is fixed on the terminal A of the detecting line 10, but the second probe 32 is movable. It can scan the detecting line 10 within a specific region since the moving range of the second probe 32 is very small, and the moving range of the second probe 32 needs to be controlled precisely. In the present invention, the second probe 32 is driven by a piezo closed-loop feedback system 36, so as to control the moving range of the second probe 32 precisely.

The second probe 32 scans the detecting line 10 from terminal B to terminal A, and during the scanning process, the fault portion 12 can be detected. For example, if the detecting line 10 has an open fault within the fault portion 12, during the process for scanning the detecting line 10 from the terminal B to terminal A, the electronic measurement system that is connected with the second probe 32 cannot receive any signals between the terminal B and the fault portion 12. However, after the second probe 32 scans, passing through the fault portion 12, the electronic measurement system can receive some signals from the detecting line 10. In this way, the location of the fault portion 12 can be detected. In other words, the fault portion 12 is disposed between the position that the electronic measurement system can receive some signals and another position that the electronic measurement system cannot receive any signal.

Figure 2:
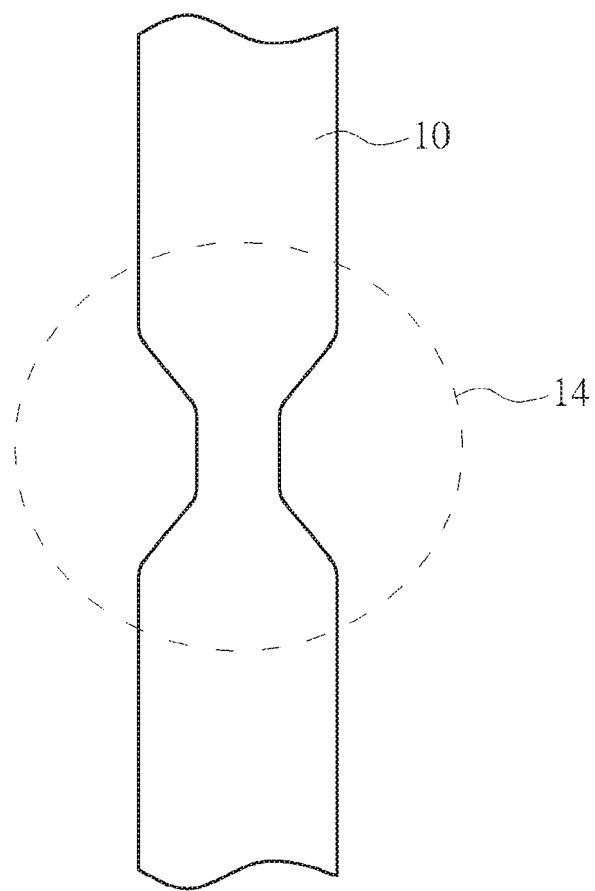
FIG. 2 shows an example of the necking issue that implies a resistive issue.

In another case, if the detecting line 10 has a necking fault within the fault portion 12, which means the detecting line 10 has a necking portion 14, and the diameter of the necking portion is much smaller than that in other places (as shown in FIG. 2, which shows an example of the necking issue), this causes the resistance within the necking portion 14 to be higher than the resistance within other places. By the scanning method mentioned above, the necking portion 14 can also be detected easily. More precisely, when the second probe 32 scans, passing through the necking portion 14, the signal that is received by the electronic measurement system will be significantly changed. Therefore, the position of the necking portion 14 can be decided.

In this embodiment, the first probe 22 has a first end portion, and the second probe 32 has a second end portion. The first end portion and the second end portion are sharp-shaped structures, and preferably, both the curvature radius of the first end portion and the curvature radius of the second end portion are smaller than 300 nanometers (nm).

By the method mentioned above, the fault portion 12 can be detected easily. However, since the electronic circuit (such as a memory device) becomes smaller, the component density becomes higher and higher. One component, for example, a bit line may be connected with a large number of elements (such as the memory cells), so the scanning method mentioned above will spend a lot of time searching for the position of the fault portion 12, thereby increasing the process cost. Furthermore, due to the electronic circuit usually being a multiple-layered structure, and some faults may disposed under other elements, it is almost impossible to find and localize the position of the fault portion 12 by focused ion beam slice and view (S&V) inspection or scanning electron microscope methods, since the diagnostic area is too large and the fault is minor.

Figure 3:
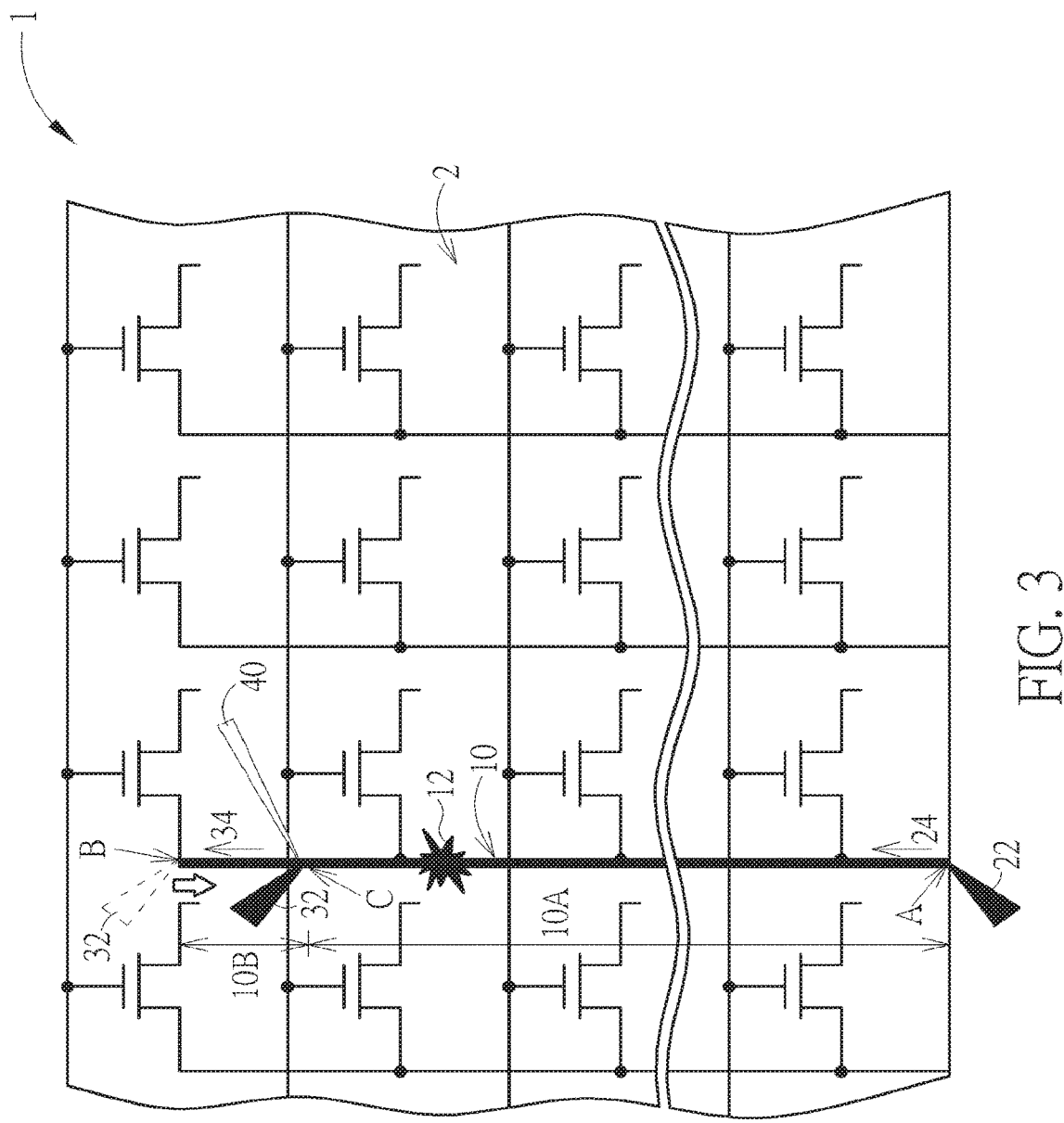
FIG. 3 shows a detecting line of the diagnostic area and a fault isolation system according to the second preferred embodiment of the present invention.

To solve the issues mentioned above, please refer to FIG. 3, which shows a detecting line and a fault isolation system 1 according to the second preferred embodiment of the present invention. As shown in FIG. 3, the fault isolation system 1 also comprises the diagnostic area with detecting line 10, the first probe 22 and the second probe 32. They are similar to that of mentioned in the first preferred embodiment, and will not be described again. The difference between this embodiment and the first preferred embodiment is that this embodiment further comprises a cutter 40 in the fault isolation system. The cutter 40 is used for cutting or milling a small portion of the detecting line 10, so as to electrically isolate the detecting line 10 of diagnostic area into two parts: a remaining detecting line 10A (the range is from the terminal A to the cutting point C) and a removed segment 10B (the range is from the terminal B to the cutting point C). It is noteworthy that the removed segment 10B is not removed completely, and it still exists on the substrate, but the removed segment 10B is electrically isolated from the remaining detecting line 10A.

More precisely, in this embodiment, the first probe 22 touches the terminal A for providing the input signal 24 to the detecting line 10, and the second probe 32 touches the terminal B for detecting or receiving the output signal 34, because the detecting line 10 has a fault portion 12 disposed therein, the output signal 34 detected by the electronic measurement system will be an abnormal output signal. In other words, since a fault is disposed within the range between the terminal A and the terminal B, the output signal that is observed should be an abnormal output signal that is different from a normal output signal. For example, the output signal 34 may not be detected while an opening issue occurs, or the output signal is either much larger or much smaller than a predetermined value while the necking issue mentioned above occurs. In another case, the abnormal output signal 34 may also show other issues, such as a shorting issue occurring.

Next, using the cutter 40 to cut the detecting line 10, for example, the detecting line 10 is cut in point C, after the detecting line 10 is cut, the range of the remaining detecting line 10A is from the terminal A to the terminal C, and the range of the removed segment 10B is from the terminal B to the terminal C. Afterwards, the second probe 32 is moved to the area between terminal A and terminal C, and detects the output signal again.

Figure 4:
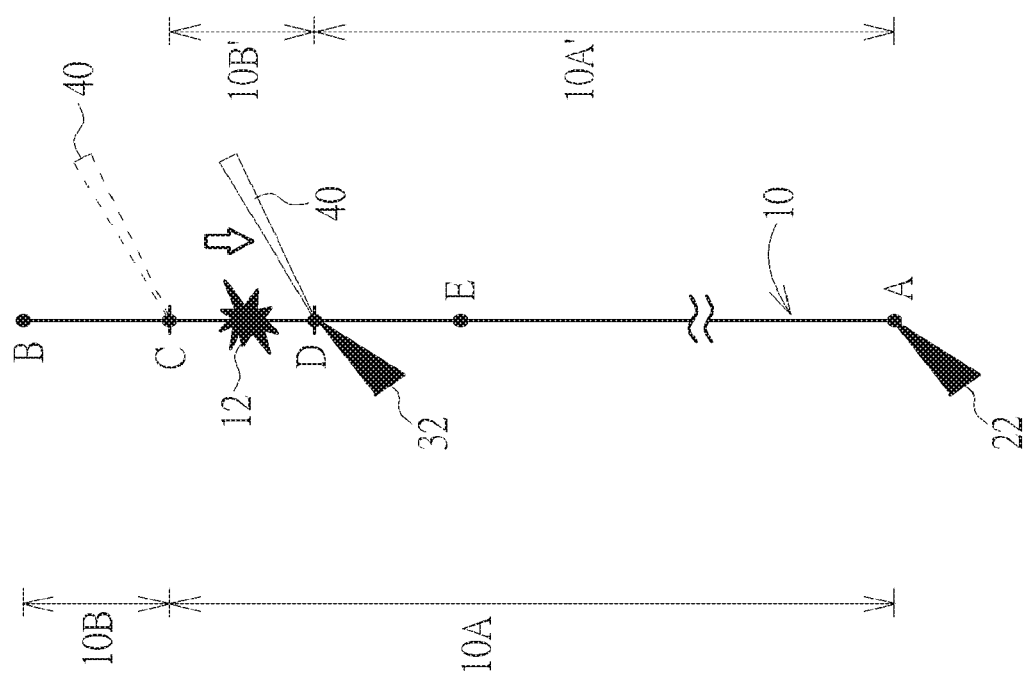
FIG. 4 shows the condition of the remaining detecting line when cut by the cutter again.

In one case, if the detected output signal 34 is still an abnormal signal, it means the fault portion 12 is still disposed within the range of the remaining detecting line 10A (the path A-B). Afterwards, please refer to FIG. 4, which shows the condition of the remaining detecting line when it is cut by the cutter again. For simplifying the figure, FIG. 4 only shows the detecting line 10, the fault portion 12, the first probe 22, the second probe 32 and the cutter 40. As shown in FIG. 4, in step (a): the cutter 40 is moved from the point C to the point D, and the cutter 40 is used to cut the remaining detecting line 10A again, so as to define a remaining detecting line 10A' (the path A-D) and a removed segment 10B' (the path C-D), and step (b) comprises:

moving the second probe 32 to the area between terminal A and terminal D (point D) to detect the output signal again. The step (a) and the step (b) mentioned above will be performed repeatedly, until the output signal 34 becomes a normal signal. In this case, the fault portion 12 is disposed within the removed segment 10B' (the path C-D). However, in another case, if the fault portion 12 still disposed within the remaining detecting line 10A', therefore, the output signal detected by second probe 32 at 10A' region is still an abnormal signal, in that case, the cutter 40 will be moved from point D to another point that is disposed between the point D and point A (such as point E in FIG. 4) again, so as to cut the remaining detecting line. Afterwards, the second probe 32 is then moved to touch the point E. This occurs until the output signal becomes a normal signal.

It is noteworthy that since the first probe 22 is fixed and the second probe 32 is movable, the points C, D, E and others points are preferably arranged along from the path point B to the point A. For example, in this embodiment, the point C is disposed between point A and point B, and preferably disposed closer to point B; the point D is disposed between point A and point C, and preferably disposed closer to point C; the point E is disposed between point A and point D, and preferably disposed closer to point D.

In another case, if the output signal 34 becomes a normal signal, it means the fault portion 12 is disposed out of the range of the remaining detecting line 10A, and disposed within the range of the removed segment 10B (in this case, the fault portion 12 is disposed between the range between point C and point D). If the step (a) and the step (b) are performed for n times, the fault portion 12 is disposed within the range of the $n^{th}$ removed segment during the $n^{th}$ time cutting process (for example, the first removed segment is the path B-C, the second removed segment is the path C-D . . . ). Next, since the range of the removed segment 10B is much smaller than the original diagnostic area with the whole detecting line 10, the position of the fault portion 12 can be identified by further electrical characterization or scanning electron microscope inspection easily. Preferably, the ratio of a total length of the detecting line 10 to a length of the fault localized segment (such as the removed segment 10B) is between 5 and 20. In this case, the detecting line 10 is larger than 50 and the length of each removed segment is about 4.5 µm. In other words, the length of each removed segment is less than 1/10 the length of the detecting line 10, and the further analysis only needs to be performed within the narrowed down range (the removed segment), thereby saving a lot of analysis time for searching for the fault position.

Figure 5:
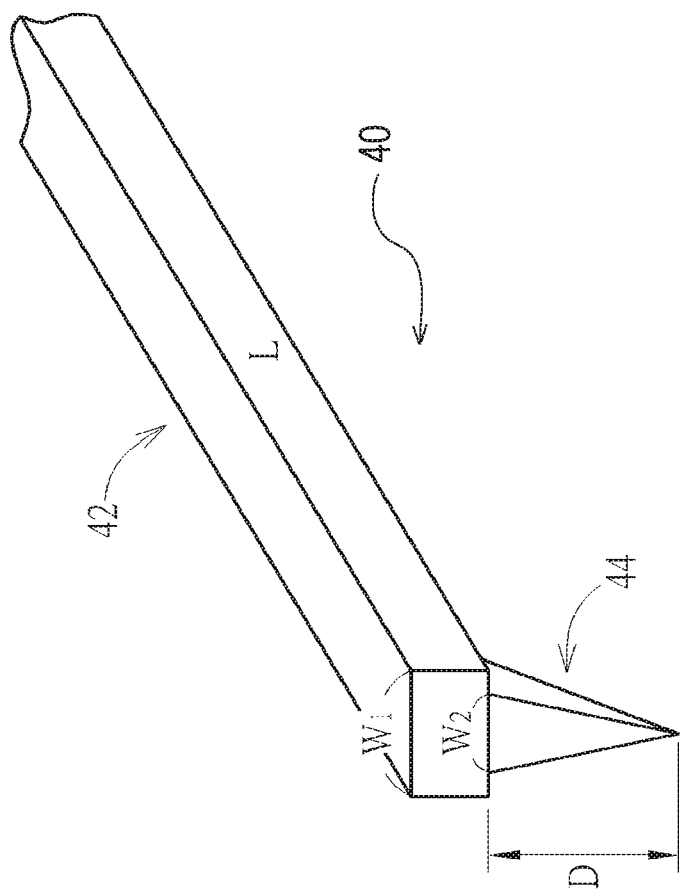
FIG. 5 shows the structure of the cutter of the present invention.

As shown in FIG. 5, in the present invention, the cutter 40 includes two portions: a rod portion 42 and a tip portion 44. The rod portion 42 maybe a column shaped structure, and the cross section of the rod portion 42 may include a square shape, a rectangular shape, a circle shape or other shapes. Preferably, the length L of the rod portion 42 is smaller than 1 mm, the width W1 or the radius of the portion of the rod portion 42 is larger than 1 µm, and the cross section area of the rod portion 42 is larger than 100 µm², but is not limited thereto. Besides, the spring constant k of the rod portion (please refer to Hooke's law, F=−kX) is larger than 5 N/m, but is not limited thereto.

The tip portion 44 of the cutter 40 may be a conical shape structure or a pyramid shape structure, the tip portion 44 is made of hard materials with a Mohs hardness greater than 6, such as silicon nitride (SiN), silicon carbide (SiC) or diamond like carbon (DLC), but is not limited thereto. In addition, the aspect ratio of the tip portion (the width W2 of the tip portion 44/the depth D of the tip portion 44) is smaller than 0.95 and the depth D of the tip portion 44 is >10 nm. The curvature radius of the tip portion 44 is smaller than 300 nanometers (nm). Besides, during the cutting process, the downward force that is provided by the cutter 40 is preferably larger than 10 nN, so as to ensure the detecting line 10 can be cut by the cutter 40.

In summary, the present invention provides a method for detecting errors in a circuit and a fault isolation system. One feature of the present invention is using the movable second probe to scan the vias or detecting line of diagnostic area, so as to find the fault portion precisely, and another feature of the present invention is using the cutter to narrow down the fault range. In this way, the further electrical and physical analysis only needs to be performed within a specific small range. Therefore, it saves a lot of analysis time and also makes the minor fault localization possible.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for detecting faults in a circuit, comprising:
   touching with a first probe one terminal of a detecting line having a fault portion to provide an input signal to a diagnostic area through the detecting line, and touching another terminal of the detecting line with a second probe to receive an output signal;
   removing a segment of the detecting line to define a remaining detecting line; and
   moving the second probe to touch a terminal of the remaining detecting line to obtain a new output signal comprising a first signal, which is within a predetermined range set by a user if the fault portion is not within the remaining detecting line, and the new output signal is a second signal, which is out of the predetermined range set by the user if the fault portion is within the remaining detecting line.

2. The method of claim 1, wherein removing the segment of the detecting line comprises removing less than one-tenth of a length of the detecting line.

3. The method of claim 1, wherein removing the segment of the detecting line comprises electrically isolating the segment from the remaining detecting line without completely removing the segment from a substrate bearing the detecting line.

4. The method of claim 1, further comprising:
   repeating the removing a segment of the detecting line and the moving of the second probe to touch a terminal of the remaining detecting line until the new output signal comprises the first signal and a fault localized segment having the fault portion disposed therein is located.

5. The method of claim 4, wherein the new output signal comprises the first signal when the fault portion corresponds to the removed segment of the detecting line.

6. The method of claim 1, wherein removing comprises cutting or milling with an instrument.

7. The method of claim 6, wherein removing comprises cutting, the cutting comprising applying a downward force with the instrument to the diagnostic area of the detecting line.

8. The method of claim 1, wherein the new output signal comprises the first signal when the fault portion corresponds to the removed segment of the detecting line.

9. The method of claim 1, further comprising providing the first probe with power from an alternating current (AC) power supply.

10. The method of claim 1, further comprising driving the second probe with a piezo closed-loop system.

11. A fault isolation system, comprising:
 a first probe for touching a terminal of a detecting line of a diagnostic area of a circuit having a fault portion and providing an input signal to the diagnostic area through the detecting line;
 a second probe for touching, scanning and sensing along the detecting line for receiving an output signal of the detecting line; and
 a tool for electrically isolating a portion of the diagnostic area that is within the detecting line.

12. The fault isolation system of claim 11, wherein the tool comprises a cutting tool or a milling tool.

13. The fault isolation system of claim 12, wherein the tool is a cutting tool configured to apply a downward force with the tool to the diagnostic area.

14. The fault isolation system of claim 12, wherein the tool is a cutting tool comprising a rod portion and a tip portion.

15. The fault isolation system of claim 14, wherein a width of the tip portion of the cutting tool is relatively less than a depth of the tip portion.

16. The fault isolation system of claim 15, wherein the tip portion is configured as a conical shape structure or a pyramidal shape structure.

17. The fault isolation system of claim 11, wherein the first probe and the second probe have an end portion, respectively, the end portion of each of the first probe and the second probe comprising a tip having a cross-sectional area relatively less than a base thereof.

18. The fault isolation system of claim 11, further comprising an alternating current (AC) power source operably coupled to the first probe.

19. The fault isolation system of claim 11, further comprising a piezo closed-loop drive system operably coupled to the second probe.

20. The fault isolation system of claim 11, wherein the second probe is movable along the detecting line.

* * * * *

UNITED STATES PATENT AND TRADEMARK OFFICE
CERTIFICATE OF CORRECTION

PATENT NO. : 10,393,801 B2
APPLICATION NO. : 15/715403
DATED : August 27, 2019
INVENTOR(S) : Wei-Chih Wang, Bi-Jen Chen and Hua-Sheng Chen It is certified that error appears in the above-identified patent and that said Letters Patent is hereby corrected as shown below:

In the Specification
Column 5, Line 43, change "than 50 and" to --than 50 µm and--

Signed and Sealed this
Eighth Day of October, 2019

Andrei Iancu
*Director of the United States Patent and Trademark Office*